United States Patent
Koo

(10) Patent No.: US 9,858,970 B2
(45) Date of Patent: Jan. 2, 2018

(54) POWER SUPPLY CIRCUIT AND SEMICONDUCTOR MEMORY DEVICE INCLUDING THE SAME

(71) Applicant: SK hynix Inc., Gyeonggi-do (KR)

(72) Inventor: Bon Kwang Koo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/807,729

(22) Filed: Jul. 23, 2015

(65) Prior Publication Data
US 2016/0260463 A1    Sep. 8, 2016

(30) Foreign Application Priority Data

Mar. 3, 2015   (KR) .................. 10-2015-0029824

(51) Int. Cl.
*G11C 11/34* (2006.01)
*G11C 5/14* (2006.01)
*G11C 7/10* (2006.01)

(52) U.S. Cl.
CPC ............ *G11C 5/147* (2013.01); *G11C 7/1084* (2013.01)

(58) Field of Classification Search
USPC ................................................ 365/189.05
See application file for complete search history.

(56) References Cited

U.S. PATENT DOCUMENTS

| | | | |
|---|---|---|---|
| 2006/0044884 A1* | 3/2006 | Chae ............... | G11C 16/30 365/189.09 |
| 2010/0301819 A1* | 12/2010 | Wang ............... | G05F 1/56 323/282 |
| 2014/0078828 A1 | 3/2014 | Gasquet et al. | |
| 2014/0103890 A1* | 4/2014 | Naidu ............... | G05F 1/56 323/269 |
| 2014/0169064 A1 | 6/2014 | Choi | |
| 2014/0313828 A1* | 10/2014 | Tanzawa .......... | G11C 16/10 365/185.11 |

FOREIGN PATENT DOCUMENTS

KR    1020100116328    11/2010

* cited by examiner

*Primary Examiner* — Anthan Tran
(74) *Attorney, Agent, or Firm* — IP & T Group LLP

(57) ABSTRACT

A power supply circuit includes a first transistor and a second transistor electrically coupled between a power supply terminal and an output terminal. When a first current path, in which output terminal through the first transistor, is formed, a voltage level of the output terminal may be controlled to be greater than or equal to a predetermined level. When a second current path, in which a current flows from the power supply terminal to the output terminal through the second transistor, is formed, the voltage level of the output terminal may be controlled to be less than or equal to the predetermined level.

13 Claims, 2 Drawing Sheets

| CLASSIFICATION | LEVEL (V) OF VOLTAGE REQUEST BY EXTERNAL DEVICE | EN_P |
|---|---|---|
| 1 | 0.5 | High |
| 2 | 1 | High |
| 3 | 1.5 | Low |
| 4 | 2 | Low |
| 5 | 2.5 | Low |

POWER SUPPLY CIRCUIT AND SEMICONDUCTOR MEMORY DEVICE INCLUDING THE SAME

CROSS-REFERENCE TO RELATED APPLICATION

The present application claims priority to Korean patent application number 10-2015-0029824 filed on Mar. 3, 2015, in the Korean Intellectual Property Office, the entire disclosure of which is incorporated by reference herein.

BACKGROUND

1. Field

The present invention relates to an electronic device, and more particularly, to a power supply circuit and a semiconductor memory device including the same.

2. Discussion of Related Art

Instead of Hard Disk Drives (HDD), which are slow, heavy, large, and emit noise, the use of semiconductor memory devices has increased.

Semiconductor memory devices are memory devices that use semiconductors, such as silicon (Si), germanium (Ge), gallium arsenide (GaAs), and indium phosphide (InP). Semiconductor memory devices are generally classified into volatile and nonvolatile memory devices.

Volatile memory devices are unable to maintain their data without a constant source of power. Volatile memory devices include Static RAM (SRAM), Dynamic RAM (DRAM), Synchronous DRAM (SDRAM), and the like. Nonvolatile memory devices are able to maintain their data even without a constant source of power. Nonvolatile memory devices include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. Flash memory is generally divided into a NOR type and a NAND type.

For operations such as read, program, and erase, various voltages need to be supplied to a memory cell array of the semiconductor memory device. Research on power supply circuits that generate such voltages has been conducted. In particular, research has been conducted on decreasing the amount of chip area consumed by the power supply circuit, decreasing the voltage drop of the power supply circuit, and expanding the range of the output voltages of the power supply circuit.

SUMMARY

The present invention has been made in an effort to provide a power supply circuit that occupies less chip area, has a decreased voltage drop, and has an increased output voltage level range, and a semiconductor memory device including the same.

An exemplary embodiment of the present invention provides a power supply circuit, including: a first transistor and a second transistor electrically coupled between a power supply terminal and an output terminal. When a first current path, in which an output terminal through the first transistor is formed, a voltage level of the output terminal may be controlled to be a predetermined level. When a second current path, in which a current flows from the power supply terminal to the output terminal through the second transistor, is formed, the voltage level of the output terminal may be controlled to be less than or equal to the predetermined level.

The power supply circuit may further include a third transistor electrically coupled to the first transistor in series between the output terminal and the power supply terminal. When the voltage level of the output terminal is controlled to be greater than or equal to the predetermined level, the second transistor may be turned off, so that only the first current path may be formed. When the voltage level of the output terminal is controlled to be less than or equal to the predetermined level, the third transistor may be turned off, so that only the second current path may be formed.

A threshold voltage of the first transistor may be a negative voltage, and a threshold voltage of the second transistor may be a positive voltage.

The power supply circuit may further include: a first switch suitable for outputting a first control signal to a gate of the first transistor; and a second switch suitable for outputting a second control signal to a gate of the second transistor. An entire enable signal and an individual enable signal may be input into the second switch, and the entire enable signal and an inverted individual enable signal may be input into the first switch.

The power supply circuit may further include: a first resistor electrically coupled between a ground and a first node; a second resistor electrically coupled between the first node and the output terminal; a comparing unit suitable for comparing a reference voltage level with a voltage level of the first node, and outputting a third control signal based on a result of the comparison; a fourth transistor electrically coupled with the ground and a second node, the third control signal being applied to a gate electrode thereof; and a third resistor electrically coupled between the second node and the power supply terminal.

A level of the entire enable signal may be determined based on a voltage level of the output terminal and a target voltage level requested by an external device. A level of the individual enable signal may be determined based on whether the target voltage level requested by the external device is larger than the predetermined level. The level of the entire enable signal may correspond to a voltage level of the second node. The target voltage level requested by the external device may be expressed by a function of the reference voltage level, the first resistor, and the second resistor.

When the individual enable signal has a high level, the first control signal may have a low level, and a level of the second control signal may correspond to a level of the entire enable signal. When the individual enable signal has a low level, the level of the first control signal may correspond to a level of the entire enable signal and the second control signal may have a low level.

When the individual enable signal has the high level, the second current path may be blocked and the first current path may be formed, and a level of the current flowing through the first current path may be feedback-controlled by the level of the entire enable signal. When the individual enable signal has the low level, the first current path may be blocked and the second current path may be formed, and a level of the current flowing through the second current path may be feedback-controlled by the level of the entire enable signal.

Another exemplary embodiment of the present invention provides a semiconductor memory device, including: a memory cell array including a plurality of memory cells; an input/output interface suitable for receiving data and a command from the external device; a page buffer suitable for receiving the data; a control logic suitable for receiving the command and generating a voltage supply control signal; and a power supply unit including a power supply device, and suitable for receiving the voltage supply control signal from the control logic, and supplying a memory driving voltage for driving the memory cell array. A level of the memory driving voltage is determined based on a voltage level of the voltage supply control signal. The power supply device may include a first transistor and a second transistor electrically coupled between a power supply terminal providing an input voltage and an output terminal outputting the memory driving voltage. When a first current path, in which a current flows from the power supply terminal to the output terminal through the first transistor, is formed, a voltage level of the memory driving voltage is controlled to be greater than or equal to a predetermined level. When a second current path, in which a current flows from the power supply terminal to the output terminal through the second transistor, is formed, a voltage level of the memory driving voltage is controlled to be less than or equal to the predetermined level.

A threshold voltage of the first transistor may be a negative voltage, and a threshold voltage of the second transistor may be a positive voltage. The power supply device may further include a third transistor electrically coupled to the first transistor in series between the output terminal and the power supply terminal. When the voltage level of the memory driving voltage is controlled to be greater than or equal to the predetermined level, the second transistor may be turned off, so that only the first current path may be formed. When the voltage level of the memory driving voltage is controlled to be less than or equal to the predetermined level, the third transistor may be turned off, so that only the second current path may be formed.

The power supply circuit may further include: a first switch suitable for outputting a first control signal to a gate of the first transistor; and a second switch suitable for outputting a second control signal to a gate of the second transistor. An entire enable signal and an individual enable signal may be input into the second switch. The entire enable signal and an inverted individual enable signal may be input into the first switch.

The power supply circuit may further include: a first resistor electrically coupled between a ground and a first node; a second resistor electrically coupled between the first node and the output terminal; a comparing unit suitable for comparing a reference voltage level with a voltage level of the first node, and outputting a third control signal based on a result of the comparison; a fourth transistor electrically coupled between the ground and a second node, the third control signal being applied to a gate electrode thereof; and a third resistor electrically coupled between the second node and the power supply terminal.

The level of the entire enable signal may correspond to a voltage level of the second node. A voltage level of the second node may be determined based on a voltage level of the output terminal and a target voltage level requested by an external device. The target voltage level requested by the external device may be expressed by a function of the reference voltage level, the first resistor, and the second resistor. A level of the individual enable signal may be determined based on whether the target voltage level requested by the external device is larger than the predetermined level. A level of at least one of the reference voltage level, the first resistor, and the second resistor may be changed based on a voltage level of the voltage supply control signal.

When the individual enable signal has a high level, the first control signal may have a low level, and a level of the second control signal may correspond to a level of the entire enable signal. When the individual enable signal has a low level, the level of the first control signal may correspond to a level of the entire enable signal and the second control signal has a low level.

When the individual enable signal has a high level, the second current path may be blocked and the first current path may be formed, and a level of the current flowing through the first current path may be feedback-controlled by the level of the entire enable signal. When the individual enable signal has a low level, the first current path may be blocked and the second current path may be formed, and a level of the current flowing through the second current path may be feedback-controlled by the level of the entire enable signal.

According to the exemplary embodiments of the present invention, it is possible to provide a power supply circuit that occupies less chip area, has a decreased voltage drop, and an increased output voltage range, and a semiconductor memory device including the same.

The foregoing summary is illustrative only and is not intended to be limiting in any way. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
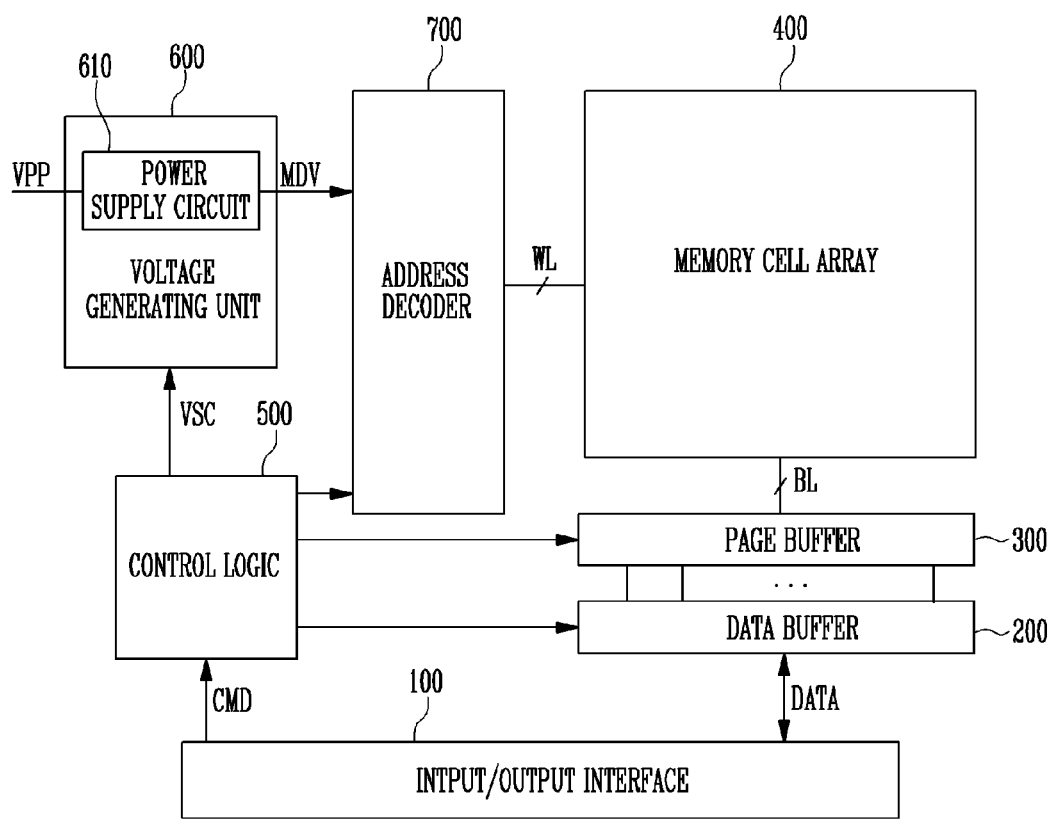
FIG. 1 is a diagram for describing an exemplary embodiment of the present invention.

Hereinafter, exemplary embodiments of the present invention will be described in detail with reference to the accompanying drawings. Like reference numerals refer to like elements throughout the specification. In the following description, when the detailed description of well-known functions or configurations is unnecessary to those skilled in the art to practice this invention, it is not provided. Further, names of constituent elements used may be selected for simplicity and may be different from names of components of an actual product.

FIG. 1 is a diagram for describing a semiconductor memory device according to an exemplary embodiment of the present invention. Referring to FIG. 1, a semiconductor memory device may include an input/output interface 100, a data buffer 200, a page buffer 300, a memory cell array 400, a control logic 500, a voltage generating unit 600, and an address decoder 700.

The input/output interface 100 may receive data DATA and a command CMD from the external device (not shown). The command CMD may be transmitted to the control logic 500, and the data DATA may be transmitted to the data buffer 200. An I/O pad and the like may be used as the input/output interface.

The data buffer 200 may receive data DATA from the input/output interface 100, and transmit the received data DATA to the page buffer 300.

The page buffer 300 may receive the data DATA from the data buffer 200, and store the received data DATA in an internal latch (not shown).

The memory cell array 400 may include a plurality of pages, and each page may include a plurality of memory cells. The memory cell array 400 may be connected to the page buffer 300 through bit lines BL, and connected to the address decoder 700 through word lines WL. The data DATA from the input/output interface 100 may be programmed in the memory cell array 400.

The control logic 500 may receive the command CMD from the input/output interface 100, generate a voltage supply control signal VSC, and transmit the generated voltage supply control signal VSC to the voltage generating unit 600. The voltage generated by the voltage generating unit 600 may be determined based on the voltage supply control signal VSC.

The voltage generating unit 600 may supply a voltage used for reading, programming, and erasing at least a part of the memory cell array 400 to the address decoder 700. A voltage generated by the voltage generating unit 600 may be determined based on a voltage level of the power supply control signal VSC, and the voltage generating unit 600 may include a power supply circuit 610. The power supply circuit 610 may generate a memory cell driving voltage MDB. The memory cell driving voltage MDB may be determined based on the voltage level of the voltage supply control signal VSC.

The address decoder 700 may receive an address from the control logic 500, and select a page, which is to be read, programmed, or erased, from the memory cell array 400 based on the received address. During the read, the program, or the erase, the memory cell driving voltage MDV from the voltage generating unit 600 may be supplied to the selected page.

Figures 2, 3:
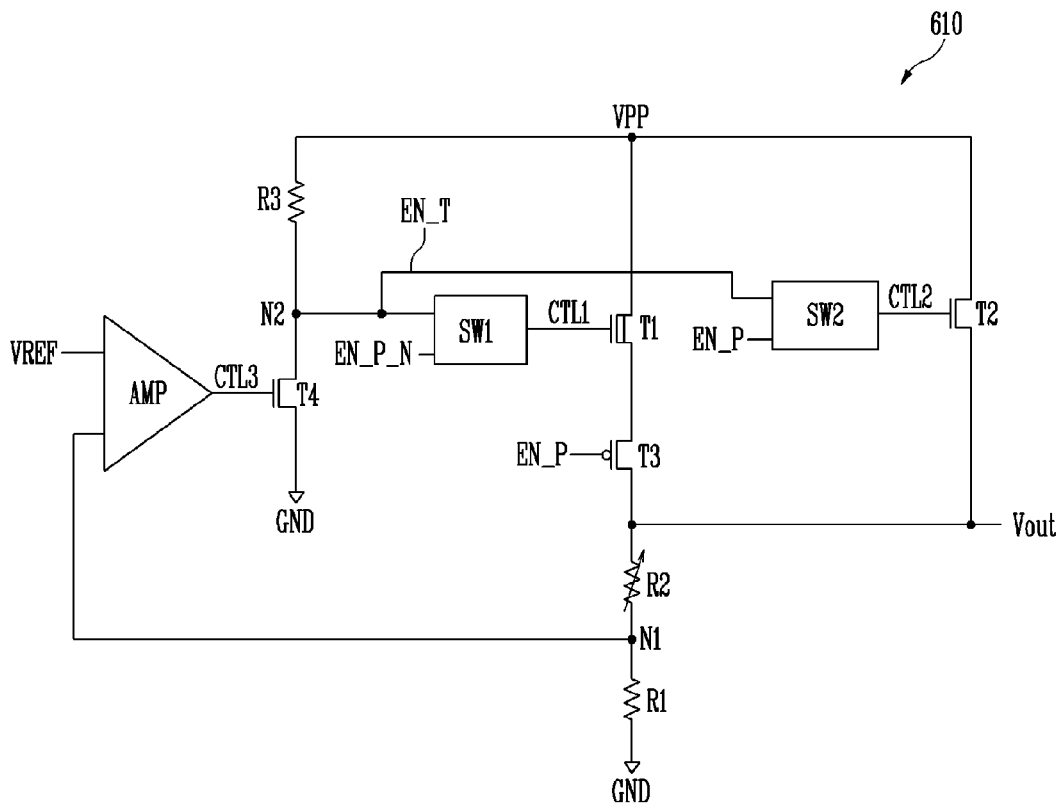
FIG. 2 is a diagram for describing a power supply circuit of the semiconductor memory device of FIG. 1.
FIG. 3 is a table for describing an individual enable signal for a power supply circuit of FIG. 2.

FIG. 2 is a diagram for describing the power supply circuit of the semiconductor memory device of FIG. 1. Referring to FIG. 2, the power supply circuit 610 may include first to fourth transistors T1 to T4, first to third resistors R1 to R3, and first and second switches SW1 and SW2, and a comparing unit AMP.

The first and second transistors T1 and T2 may be electrically coupled between a power supply terminal VPP and an output terminal Vout. The first and second transistors T1 and T2 may be connected to each other in parallel. The first and second transistors T1 and T2 may be N-type transistors. When the first transistor T1 is a depletion transistor, a threshold voltage of the first transistor T1 may be a negative voltage. When the second transistor T2 is a normal transistor, a threshold voltage of the second transistor T2 may be a positive voltage. When a voltage of the output terminal Vout is controlled by a first current path including the first transistor T1, there may be no voltage drop due to the threshold voltage, but a voltage level of the output terminal Vout may not be less than or equal to a predetermined value (for example, the threshold voltage of the first transistor T1). By contrast, when a voltage of the output terminal Vout is controlled by a second current path including the second transistor T2, a voltage level of the output terminal Vout may be less than or equal to the predetermined value, but there may be a voltage drop. That is, one of the first current path and the second current path may be selected as a current path used for controlling a voltage of the output terminal Vout based on a voltage level requested from the external device. Power for pumping (pumping bias) may be supplied to the power supply terminal VPP.

The third transistor T3 may be serially connected with the first transistor T1. In the exemplary embodiment illustrated in FIG. 2, the third transistor T3 is electrically coupled between the first transistor T1 and the output terminal Vout, but may also be electrically coupled between the first transistor T1 and the power supply terminal VPP. The third transistor T3 may be a P-type transistor, and an individual enable signal EN_P may be input into a gate of the third transistor T3. When the individual enable signal EN_P has a high level, an inverted individual enable signal EN_P_N having has a low level. When the individual enable signal EN_P has a low level, an inverted individual enable signal EN_P_N has a high level. When the individual enable signal EN_P has a high level, the third transistor T3 may be turned off, so that the first current path may be blocked. FIG. 2 describes only where the third transistor T3 is the P-type transistor and the individual enable signal EN_P is input into the gate of the third transistor T3, but the third transistor T3 may be an N-type transistor and the inverted individual enable signal EN_P_N may also be input into the gate of the third transistor T3.

The fourth transistor T4 may be electrically coupled between a ground GND and a second node N2. The fourth transistor T4 may be the N-type transistor.

The first resistor R1 may be electrically coupled between the ground GND and a first node N1, the second resistor R2 may be electrically coupled between the first node N1 and the output terminal Vout, and the third resistor R3 may be connected between the second node N2 and the power supply terminal VPP.

The first switch SW1 may receive an entire enable signal EN_T and the inverted individual enable signal EN_P_N, and output a first control signal CTL1 to the gate of the first transistor T1. When the individual enable signal EN_P has a low level, the first switch SW1 may output the entire enable signal EN_T as the first control signal CTL1. In this case, a level of the first control signal CTL1 may be substantially equal to a level of the entire enable signal EN_T. When the individual enable signal EN_P has a high level, the first switch SW1 may output the first control signal CTL1 having a low level.

The second switch SW2 may receive the entire enable signals EN_T and the individual enable signal EN_P, and output a second control signal CTL2 to a gate of the second transistor T2. When the individual enable signal EN_P has a high level, the second switch SW2 may output the entire enable signal EN_T as the second control signal CTL2. In this case, a level of the second control signal CTL2 may be substantially equal to a level of the entire enable signal EN_T. When the individual enable signal EN_P has a low level, the second switch SW2 may output the second control signal CTL2 having a low level, and the second transistor T2 may be turned off, so that the second current path may be blocked.

The comparing unit AMP may compare a reference voltage level VREF with a voltage level of the first node N1, and output a third control signal CTL3 to a gate of the fourth transistor T4 based on a result of the comparison. The comparing unit AMP may include a calculation amplifier. When the fourth transistor T4 is the N-type transistor, a voltage of the first node N1 may be supplied to a non-inverted signal input terminal of the calculation amplifier, and the reference voltage VREF may be supplied to an inverted signal input terminal of the calculation amplifier. In this case, when a voltage of the first node N1 is increased, a voltage level of the third control signal CTL3 may be increased, so that a voltage level of the second node N2 may be decreased.

The voltage level of the output terminal Vout corresponds to the memory cell driving voltage MDV and may be outputted to the external device.

A voltage level of the entire enable signal EN_T may be substantially equal to a voltage level of the second node N2. A voltage level VN1 of the first node may be expressed by Equation 1.

$$VN1 = Vout \times \frac{R1}{R1 + R2},\qquad \text{[Equation 1]}$$

where Vout is the voltage level of the output terminal Vout, R1 is a resistance level of the first resistor R1, and R2 is a resistance level of the second resistor R2.

Finally, the voltage level of the output terminal Vout may be controlled to be a target voltage level requested from the external device, and the target voltage level may be represented by Equation 2.

$$Vref \times \frac{R1 + R2}{R1} \qquad \text{[Equation 2]}$$

Where Vref is a voltage level of the reference voltage VREF.

That is, the target voltage level requested from the external device may be expressed by a function of the reference voltage VREF, the first resistor R1, and the second resistor R2. The level of at least one of the reference voltage VREF, the first resistor R1, and the second resistor R2 may be changed based on the voltage level of the voltage supply control signal VSC. The level of at least one of the reference voltage VREF, the first resistor R1, and the second resistor R2 may be changed based on the voltage level of the voltage supply control signal VSC in response to the change of the target voltage level requested by the external device. FIG. 2 illustrates that only the level of the second resistor R2 is changeable, which is, however, illustrative.

A level of the individual enable signal EN_P may be determined based on the target voltage level requested by the external device and a predetermined level. As a result, the level of the individual enable signal EN_P may be determined as represented in a table of FIG. 3. Referring to FIG. 3, when the target voltage level requested by the external device is less than or equal to the predetermined level of 1 volt (V), the individual enable signal EN_P may have a high level, and when the target voltage level requested by the external device is larger than 1 volt (V), the individual enable signal EN_P may have a low level. However, the predetermined level of 1 volt (V) is an example, and a level of the individual enable signal EN_P may be determined based on whether the target voltage level requested by the external device is larger than an absolute value of the threshold voltage of the first transistor T1.

When the target voltage level requested by the external device is smaller than the threshold voltage of the first transistor T1, the individual enable signal EN_P may have a high level. Accordingly, the first control signal CTL1 may have a low level. The threshold voltage of the first transistor T1 may be a negative voltage. Therefore, even though the first transistor T1 is not completely turned off, the third transistor T3 may be completely turned off and thus the first current path may be blocked and only the second current path may be formed.

A level of the second control signal CTL2 may be substantially equal to the level of the entire enable signal EN_T, and thus a level of a current flowing through the second current path may be feedback-controlled by the level of the entire enable signal EN_T.

For example, when a voltage level of the output terminal Vout is larger than the target voltage level represented by Equation 2, a level of the third control signal CTL3 may be increased. A current flowing from the second node N2 to the ground GND through the fourth transistor T4 may be increased, and thus a voltage level of the second node N2 and the level of the entire enable signal EN_T may be decreased. Since the level of the second control signal CTL2 may be decreased by the decrease in the level of the entire enable signal EN_T, a level of the current flowing through the second current path may be also decreased and thus the voltage level of the output terminal Vout may be decreased.

By contrast, when a voltage level of the output terminal Vout is smaller than the target voltage level represented by Equation 2, a level of the third control signal CTL3 may be decreased and the voltage level of the second node N2 and the level of the entire enable signal EN_T may be increased, and therefore a level of the current flowing through the second current path may also be increased and the voltage level of the output terminal Vout may be increased.

When the target voltage level requested by the external device is smaller than the threshold voltage or the predetermined voltage level of the first transistor T1, the second current path may be formed, and thus the voltage level of the output terminal Vout may be controlled to be less than or equal to the predetermined voltage level.

When the target voltage level requested by the external device is larger than the threshold voltage of the first transistor T1, the individual enable signal EN_P may have a low level. Accordingly, the second control signal CTL1 may have a low level, and the second transistor T2 may be turned off and the third transistor T3 may be turned on among the first to third transistors T1 to T3. Accordingly, the second current path may be blocked, and only the first path may be formed.

The level of the first control signal CTL1 may be substantially equal to the level of the entire enable signal EN_T, and thus a level of a current flowing through the first current path may be feedback-controlled by the level of the entire enable signal EN_T. The feedback-control of the level of the current flowing through the first current path may be the same as the feedback-control of the level of the current flowing through the second current path described above.

When the target voltage level requested by the external device is greater than or equal to the threshold voltage or the predetermined voltage level of the first transistor T1, the first current path may be formed, and thus the voltage level of the output terminal Vout may be controlled to be greater than or equal to the predetermined voltage level. In the above description, the types of transistors, the levels of the control signals, and the like are only examples and other implementations are possible.

As described above, embodiments have been disclosed in the drawings and the specification. The specific terms used herein are for illustration, and do not limit the scope of the present invention as defined in the claims. Accordingly, those skilled in the art will appreciate that various modifications and another equivalents may be made without departing from the scope and spirit of the present disclosure.

Therefore, the scope of the present invention will be defined by the technical spirit of the accompanying claims.

What is claimed is:

1. A power supply circuit, comprising:
   a power supply terminal;
   an output terminal;
   a first transistor and a second transistor electrically coupled between the power supply terminal and the output terminal;
   a first switch suitable for outputting a first control signal to a gate of the first transistor and for turning on and off the first transistor; and
   a second switch suitable for outputting a second control signal to a gate of the second transistor and for turning on and off the second transistor,
   wherein when a first request for generating a target voltage level of the output terminal greater than a predetermined level is received, a first current path, in which a current flows from the power supply terminal to the output terminal through the first transistor, is formed in response to the first request, and the second transistor is turned off, so that only the first current path is formed between the power supply terminal and the output terminal,
   wherein when a second request for generating the target voltage level of the output terminal less than the predetermined level is received, a second current path, in which a current flows from the power supply terminal to the output terminal through the second transistor, is formed in response to the second request, and the first transistor is turned off, so that only the second current path is formed between the power supply terminal and the output terminal,
   wherein the first switch and the second switch are suitable for turning on the first transistor and the second transistor alternatively,
   wherein an entire enable signal and an individual enable signal are input into the second switch, and
   wherein the entire enable signal and an inverted individual enable signal are input into the first switch.

2. The power supply circuit of claim 1, further comprising:
   a third transistor electrically coupled to the first transistor in series between the output terminal and the power supply terminal,
   wherein when the second request is received, the third transistor is turned off, so that only the second current path is formed between the power supply terminal and the output terminal.

3. The power supply circuit of claim 2, wherein a threshold voltage of the first transistor is a negative voltage, and a threshold voltage of the second transistor is a positive voltage.

4. The power supply circuit of claim 1, further comprising:
   a first resistor electrically coupled between a ground and a first node;
   a second resistor electrically coupled between the first node and the output terminal;
   a comparing unit suitable for comparing a reference voltage level with a voltage level of the first node, and outputting a third control signal based on a result of the comparison;
   a fourth transistor electrically coupled with the ground and a second node, the third control signal being applied to a gate electrode thereof; and
   a third resistor electrically coupled between the second node and the power supply terminal.

5. The power supply circuit of claim 4,
   wherein a level of the entire enable signal is determined based on the voltage level of the output terminal and the target voltage level requested by an external device,
   wherein a level of the individual enable signal is determined based on whether the target voltage level requested by the external device is greater than the predetermined level,
   wherein the level of the entire enable signal is substantially equal to a voltage level of the second node, and
   wherein the target voltage level requested by the external device is expressed by a function of the reference voltage level, the first resistor, and the second resistor.

6. The power supply circuit of claim 1,
   wherein when the individual enable signal has a high level, the first control signal has a low level and the second control signal has a level is substantially equal to a level of the entire enable signal, and
   wherein when the individual enable signal has a low level, the first control signal has a level substantially equal to the level of the entire enable signal and the second control signal has a low level.

7. The power supply circuit of claim 6,
   wherein when the individual enable signal has the high level, the second current path is blocked and the first current path is formed, and a level of the current flowing through the first current path is feedback-controlled by the level of the entire enable signal, and
   wherein when the individual enable signal has the high level, the first current path is blocked and the second current path is formed, and a level of the current flowing through the second current path is feedback-controlled by the level of the entire enable signal.

8. A semiconductor memory device, comprising:
   a memory cell array including a plurality of memory cells;
   an input/output interface suitable for receiving data and a command from the external device;
   a page buffer suitable for receiving the data;
   a control logic suitable for receiving the command and generating a voltage supply control signal; and
   a power supply unit including a power supply device, and suitable for receiving the voltage supply control signal from the control logic, and supplying a memory driving voltage for driving the memory cell array in response to the voltage supply control signal,
   wherein a voltage level of the memory driving voltage is determined based on a voltage level of the voltage supply control signal,
   wherein the power supply device includes:
     a first transistor and a second transistor electrically coupled between a power supply terminal and an output terminal outputting the memory driving voltage;
     a first switch suitable for outputting a first control signal to a gate of the first transistor and for turning on and off the first transistor; and
     a second switch suitable for outputting a second control signal to a gate of the second transistor and for turning on and off the second transistor,
   wherein when the power supply unit receives the voltage supply control signal for supplying the memory driving voltage having a target voltage level greater than a predetermined level, a first current path, in which a current flows from the power supply terminal to the output terminal through the first transistor, is formed, and the second transistor is turned off, so that only the first current path is formed between the power supply terminal and the output terminal, wherein when the power supply unit receives the voltage supply control signal for supplying the memory driving voltage having the target voltage level less than the predetermined level, a second current path, in which a current flows from the power supply terminal to the output terminal through the second transistor, is formed, and the first transistor is turned off, so that only the second current path is formed between the power supply terminal and the output terminal, wherein the first switch and the second switch are suitable for turning on the first transistor and the second transistor alternatively, wherein an entire enable signal and an individual enable signal are input into the second switch, and wherein the entire enable signal and an inverted individual enable signal are input into the first switch.

9. The semiconductor memory device of claim 8, wherein a threshold voltage of the first transistor is a negative voltage, and a threshold voltage of the second transistor is a positive voltage, wherein the power supply device further includes a third transistor electrically coupled to the first transistor in series between the output terminal and the power supply terminal, wherein when the voltage level of the memory driving voltage is controlled to be less than the predetermined level, the third transistor is turned off, so that only the second current path is formed between the power supply terminal and the output terminal.

10. The semiconductor memory device of claim 8, wherein the power supply device further includes:

a first resistor electrically coupled between a ground and a first node;

a second resistor electrically coupled between the first node and the output terminal;

a comparing unit suitable for comparing a reference voltage level with a voltage level of the first node, and outputting a third control signal based on a result of the comparison;

a fourth transistor electrically coupled between the ground and a second node, the third control signal being applied to a gate electrode thereof; and a third resistor electrically coupled between the second node and the power supply terminal.

11. The semiconductor memory device of claim 10, wherein the level of the entire enable signal is substantially equal to a voltage level of the second node, wherein the voltage level of the second node is determined based on a voltage level of the output terminal and the target voltage level requested by the external device, wherein the target voltage level requested by the external device is expressed by a function of the reference voltage level, the first resistor, and the second resistor, wherein a level of the individual enable signal is determined based on whether the target voltage level requested by the external device is greater than the predetermined level, and wherein a level of at least one of the reference voltage level, the first resistor, and the second resistor is changed based on the voltage level of the voltage supply control signal.

12. The semiconductor memory device of claim 8, wherein when the individual enable signal has a high level, the first control signal has a low level and the second control signal has a level substantially equal to a level of the entire enable signal, and wherein when the individual enable signal has a low level, the first control signal has a level substantially equal to the level of the entire enable signal and the second control signal has a low level.

13. The semiconductor memory device of claim 12, wherein when the individual enable signal has a high level, the second current path is blocked and the first current path is formed, and a level of the current flowing through the first current path is feedback-controlled by the level of the entire enable signal, and wherein when the individual enable signal has a high level, the first current path is blocked and the second current path is formed, and a level of the current flowing through the second current path is feedback-controlled by the level of the entire enable signal.

* * * * *